US011024522B2

(12) United States Patent
Mungekar et al.

(10) Patent No.: US 11,024,522 B2
(45) Date of Patent: Jun. 1, 2021

(54) VIRTUAL SENSOR FOR SPATIALLY RESOLVED WAFER TEMPERATURE CONTROL

(71) Applicant: Applied Materials, Inc., Santa Clara, CA (US)

(72) Inventors: Hemant Mungekar, Campbell, CA (US); Uwe P. Haller, San Jose, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 16/383,881

(22) Filed: Apr. 15, 2019

(65) Prior Publication Data
US 2019/0362991 A1 Nov. 28, 2019

Related U.S. Application Data

(60) Provisional application No. 62/676,156, filed on May 24, 2018.

(51) Int. Cl.
| | |
|---|---|
| H01L 21/66 | (2006.01) |
| H01L 21/67 | (2006.01) |
| G06N 20/00 | (2019.01) |
| G05B 19/4155 | (2006.01) |

(52) U.S. Cl.
CPC .... *H01L 21/67103* (2013.01); *G05B 19/4155* (2013.01); *G06N 20/00* (2019.01); *H01L 21/67248* (2013.01); *H01L 22/12* (2013.01); *G05B 2219/50333* (2013.01)

(58) Field of Classification Search
None
See application file for complete search history.

(56) References Cited

U.S. PATENT DOCUMENTS

| | | | |
|---|---|---|---|
| 6,560,503 B1 | 5/2003 | Toprac et al. |
| 7,016,754 B2 | 3/2006 | Poolla et al. |
| 7,127,358 B2 | 10/2006 | Yue et al. |

(Continued)

FOREIGN PATENT DOCUMENTS

KR 20170088352 A 8/2017

OTHER PUBLICATIONS

Schaper et al. 'Control of MMST RTP: Repeatability, Uniformity, and Integration for Flexible Manufacturing' IEEE Transactions on Semiconductor Manufacturing, vol. 7, No. 2, May 1994.*

(Continued)

*Primary Examiner* — Bernard G Lindsay
(74) *Attorney, Agent, or Firm* — Patterson + Sheridan, LLP

(57) ABSTRACT

The present disclosure relate to methods and apparatus for temperature sensing and control during substrate processing. Substrate temperatures during processing, which are difficult to measure directly, may be determined by examination of deposited film properties or by measuring changes in power output over time of the substrate heating apparatus. Temperatures are determined for many substrates during processing, showing how substrate temperatures change over time, and the temperature changes are then used to build models via machine learning techniques. The models are used to adjust heating apparatus setpoints for future processing operations.

21 Claims, 6 Drawing Sheets

(56) References Cited

U.S. PATENT DOCUMENTS

| | | |
|---|---|---|
| 8,050,900 B2 | 11/2011 | Mitrovic et al. |
| 10,903,097 B2* | 1/2021 | Baggett ............. H01L 21/67103 |
| 2005/0267606 A1* | 12/2005 | Bartlett, Jr. .......... G05B 13/042 |
| | | 700/29 |
| 2007/0242263 A1* | 10/2007 | Huang ...................... G03F 1/84 |
| | | 356/128 |
| 2011/0068085 A1 | 3/2011 | Brillhart et al. |
| 2012/0031892 A1* | 2/2012 | Shigetomi ......... H01L 21/67248 |
| | | 219/444.1 |
| 2012/0118225 A1* | 5/2012 | Hsu ........................ C30B 25/10 |
| | | 117/86 |
| 2012/0231558 A1 | 9/2012 | Timans |
| 2013/0270252 A1 | 10/2013 | Ambal et al. |
| 2015/0340255 A1 | 11/2015 | Parkhe et al. |

OTHER PUBLICATIONS

Lee et al. 'Control of Wafer Temperature Uniformity in Rapid Thermal Processing Using an Optimal Iterative Learning Control Technique' Ind. Eng. Chem. Res. 2001, 40, 1661-1672.*
International Search Report and Written Opinion for International Application No. PCT/US2019/027494 dated Aug. 2, 2019.

* cited by examiner

VIRTUAL SENSOR FOR SPATIALLY RESOLVED WAFER TEMPERATURE CONTROL

CROSS-REFERENCE TO RELATED APPLICATIONS

This application claims priority to U.S. Provisional Patent Application No. 62/676,156, filed May 24, 2018, the entirety of which is herein incorporated by reference.

BACKGROUND

Field

Embodiments of the present disclosure relate to methods and apparatus for temperature sensing and control during substrate processing.

Description of the Related Art

In the processing of substrates, a substrate is typically placed on a substrate support in a process chamber while suitable process conditions are maintained in the process chamber to deposit, etch, form layers on, or otherwise treat surfaces of the substrate. For example, the substrate may be processed using a high temperature plasma processing environment. It is often desirable to control various process conditions that influence properties of the substrate during processing, such as substrate temperature.

As feature sizes for substrates are reduced and process complexity increases with advanced nodes, maintaining the temperature of the substrate being processed at a target substrate temperature is of increasing concern. The processing of the substrates in such advanced processes is highly sensitive to temperature fluctuations during processing, and controlling the temperature of the substrate is utilized to achieve processes which do not substantially exhibit temperature drift during processing. Additionally, the thermal properties of process chamber components change over time as the process chamber components age and are eventually replaced, increasing the difficulty of maintaining precise temperature control. Furthermore, direct measurement of substrate temperature is difficult, particularly for plasma-based processes.

Therefore, what is needed in the art are methods and apparatus for controlling the substrate temperature during processing.

SUMMARY

In one embodiment, a method is provided. The method includes performing a plurality of substrate processing operations on a plurality of substrates in a process chamber, wherein one of the plurality of substrates is processed during each of the plurality of substrate processing operations. The method also includes determining a substrate temperature change of each of the plurality of substrates during the plurality of substrate processing operations and inputting measured process variables into a substrate temperature change model based on the substrate temperature of each of the plurality of substrates, the substrate temperature change model comprising:

$$\Delta T_i = \int_{W_1}^{W_2} \frac{dT_i}{dW} dW$$

$$\Delta T_o = \int_{W_1}^{W_2} \frac{dT_o}{dW} dW$$

where $W_1$ is a first substrate count for a first substrate, $W_2$ is a second substrate count for the first substrate, $\Delta T_i$ and $\Delta T_o$ are the total change in temperature of the inner and outer zones, respectively, from $W_1$ to $W_2$, and $$\frac{dT_i}{dW} \text{ and } \frac{dT_o}{dW}$$

are the rate of change of inner zone temperature and outer zone temperature, respectively. The method further includes controlling one or more of temperature or power setpoints of a heater apparatus in a substrate support of the process chamber in response to an output of the substrate temperature change model.

In another embodiment, a method is provided. The method includes performing a plurality of substrate processing operations on a plurality of substrates in a process chamber, wherein one of the plurality of substrates is processed during each of the plurality of substrate processing operations, determining a temperature of an inner zone of each of the plurality of substrates during the plurality of substrate processing operations, and determining a temperature of an outer zone of each of the plurality of substrates during the plurality of substrate processing operations. The method further includes determining an inner zone temperature model based on the temperature of the inner zone of each of the plurality of substrates, determining an outer zone temperature model based on the temperature of the outer zone of each of the plurality of substrates, controlling an inner zone setpoint of a heater apparatus in a substrate support of the process chamber based on the inner zone temperature model, and controlling an outer zone setpoint of the heater apparatus in the substrate support of the process chamber based on the outer zone temperature model.

In another embodiment, a non-transitory machine readable storage medium is provided. The medium has a computer program stored thereon. The computer program is configured to determine a substrate temperature change model based on a substrate temperature of each of a plurality of substrates during each of a plurality of substrate processing operations in a process chamber and control a setpoint of a heater apparatus in a substrate support of the process chamber based on a substrate temperature model, the substrate temperature change model comprising:

$$\Delta T_i = \int_{W_1}^{W_2} \frac{dT_i}{dW} dW$$

$$\Delta T_o = \int_{W_1}^{W_2} \frac{dT_o}{dW} dW$$

where $W_1$ is a first substrate count for a first substrate, $W_2$ is a second substrate count for the first substrate, $\Delta T_i$ and $\Delta T_o$ are the total change in temperature of the inner and outer zones, respectively, from $W_1$ to $W_2$, and $$\frac{dT_i}{dW} \text{ and } \frac{dT_o}{dW}$$

are the rate of change of inner zone temperature and outer zone temperature, respectively.

BRIEF DESCRIPTION OF THE DRAWINGS

So that the manner in which the above recited features of the present disclosure can be understood in detail, a more particular description of the disclosure, briefly summarized above, may be had by reference to aspects of the disclosure, some of which are illustrated in the appended drawings. It is to be noted, however, that the appended drawings illustrate only typical aspects of this disclosure and are therefore not to be considered limiting of its scope, for the disclosure may admit to other equally effective aspects.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

The present disclosure relates to methods and apparatus for substrate temperature sensing and control during substrate processing. Substrate temperatures during processing, which are often difficult to measure directly, especially in high temperature (e.g. above about 600° C.) vacuum plasma processing operations, may be determined by examination of deposited film properties or by measuring changes in power output over time of the substrate heating apparatus. Temperatures are determined for many substrates during processing, illustrating how substrate temperatures change over time, and the temperature changes are then used to build models via machine learning techniques. The models are used to adjust heating apparatus setpoints for future processing operations.

It should be noted that heater temperature may not be the same as a substrate temperature. Measurement of substrate temperature with or without plasma may generate potentially misleading data of substrate temperature when additional sources of plasma energy are exposed to the substrate. Moreover, maintaining a given heater set point, as a process chamber ages over time, does not guarantee that the substrate temperature is maintained as desired, due to changing heat transfer between the substrate and the chamber. Thus, embodiments described herein provide for improved substrate temperature control.

Figure 1:
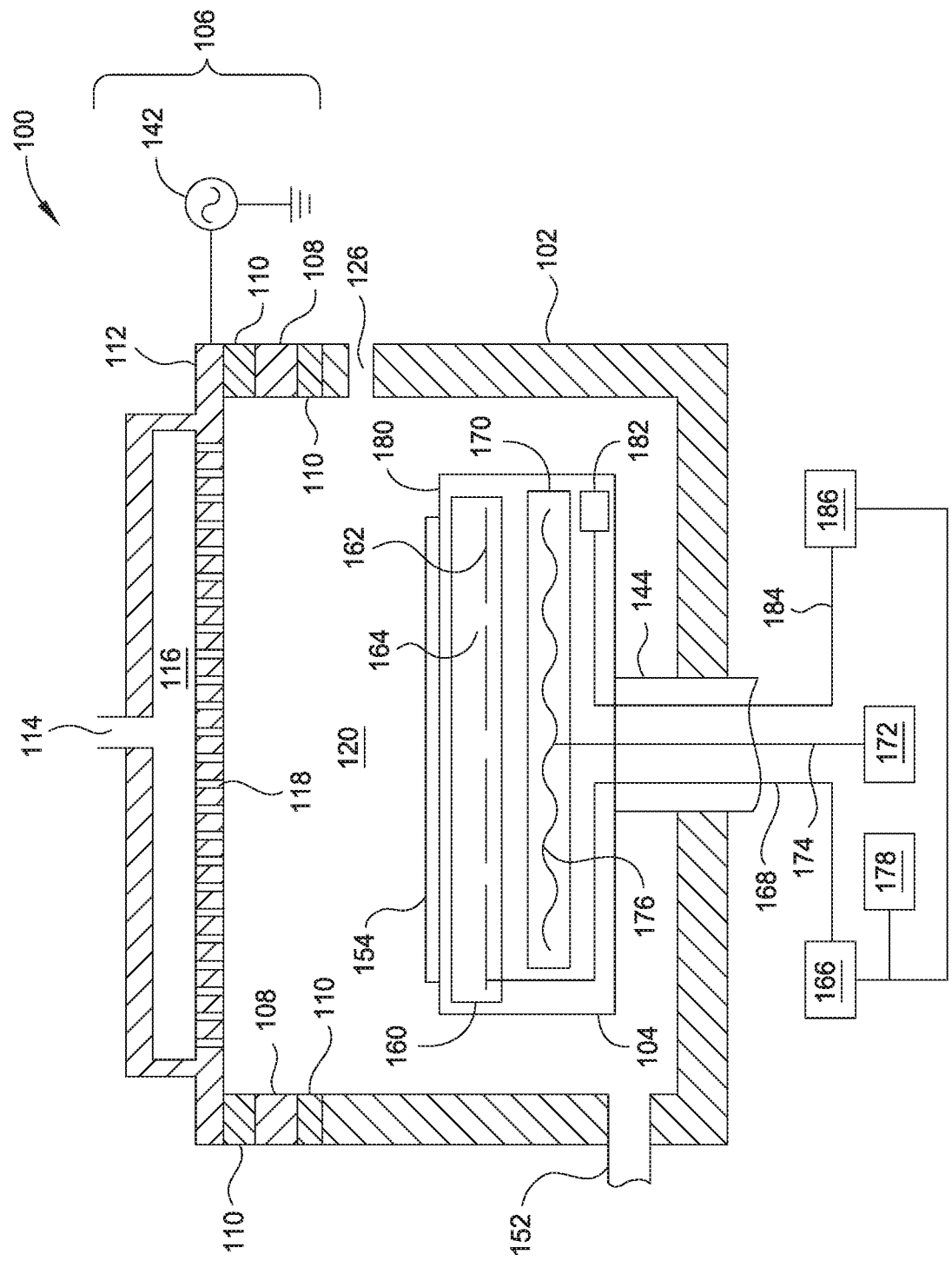
FIG. 1 illustrates a cross-sectional schematic view of a process chamber according to one embodiment.

FIG. 1 is a cross-sectional schematic view of a process chamber 100, according to one embodiment. The process chamber 100 may be a plasma enhanced chemical vapor deposition (PECVD) chamber suitable for depositing a chemical vapor deposition (CVD) film a substrate, such as a substrate 154. Examples of process chambers that may be adapted to benefit as described herein are the PRODUCER® CVD process apparatus and PRECISION™ process apparatus commercially available from Applied Materials, Inc., located in Santa Clara, Calif. Other suitably configured process chambers, including those from other manufacturers or for other applications such as PECVD of substrates, such as glass substrates, may also be used in accordance with the embodiments described herein.

The process chamber 100 may be used for various plasma processes, including deposition and removal processes. In one aspect, the process chamber 100 is used to perform CVD using one or more precursor gases with or without radio frequency (RF) power sources. In another embodiment, the process chamber 100 is used for plasma enhanced chemical vapor deposition (PECVD) processes.

The process chamber 100 includes a chamber body 102, a lid assembly 106, and a substrate support assembly 104. The lid assembly 106 is positioned at an upper end of the chamber body 102. The substrate support assembly 104 is disposed inside the chamber body 102, and the lid assembly 106 is coupled to the chamber body 102 and encloses the substrate support assembly 104 within a process volume 120. The chamber body 102 includes a slit valve opening 126 formed in a sidewall thereof. The slit valve opening 126 is selectively opened and closed to allow access to the process volume 120 by a substrate handling robot (not shown) for substrate transfer. An exhaust port 152, which is in fluid communication with the process volume 120, is shown extending through the chamber body 102.

A top electrode 108 is disposed adjacent to the chamber body 102 and separating the chamber body 102 from other components of the lid assembly 106. The top electrode 108 may be part of the lid assembly 106, or may be a separate side wall electrode.

An isolator 110, which may be a dielectric material such as a ceramic or metal oxide, for example aluminum oxide and/or aluminum nitride, contacts the top electrode 108 and separates the top electrode 108 electrically and thermally from a gas distributor 112 and from the chamber body 102. The gas distributor 112 has openings 118 for admitting process gases into the process volume 120. The process gases are supplied to the process chamber 100 via a conduit 114, and the process gases enter a gas mixing region 116 prior to flowing through the openings 118. The gas distributor 112 is coupled to a source of electric power 142, such as an RF generator. In one embodiment, a pulsed RF power is utilized to form a plasma in the process volume 120. In other embodiments, DC power or pulsed DC power are utilized to form a plasma in the process volume 120.

The substrate support assembly 104 includes a substrate support surface 180 disposed at an upper end thereof. The substrate support assembly 104 is formed from a metallic or ceramic material, for example a metal oxide or nitride or oxide/nitride mixture such as aluminum, aluminum oxide, aluminum nitride, or an aluminum oxide/nitride mixture. The substrate support surface 180 is configured to support the substrate 154 during processing. The substrate support surface 180 is coupled to a lift mechanism through a shaft 144, which extends through a bottom surface of the chamber body 102. The lift mechanism is flexibly sealed to the chamber body 102 by a bellows that prevents vacuum leakage from around the shaft 144. The lift mechanism enables the substrate support surface 180 to be moved vertically within the chamber body 102 between a lower transfer position and one or more raised process positions.

An electrostatic chuck (ESC) 160 is disposed in the substrate support assembly 104. The electrostatic chuck 160 includes one or more electrodes 162 and a dielectric material 164. In some embodiments, the dielectric material 164 of the electrostatic chuck 160 forms the substrate support surface 180. Four electrodes 162 are depicted by dashed lines in FIG. 1, however, it is contemplated that a greater of lesser number of electrodes 162 may be utilized in accordance with the embodiments described herein. The dielectric material 164 is a dielectric material suitable for use with electrostatic chucks. In embodiments of the electrostatic chuck 160, the dielectric material 164 includes oxide and/or nitride materials such as aluminum oxide, aluminum nitride, or an aluminum oxide/aluminum nitride mixture.

In one embodiment, the electrodes 162 are embedded in the dielectric material 164. In another embodiment, the electrodes 162 are embedded within the substrate support assembly 104 or coupled to a surface of the substrate support assembly 104. The one or more electrodes 162 may be a plate, a perforated plate, a mesh, a wire screen, or any other distributed arrangement. The one or more electrodes 162 are coupled to an electrode power supply 166 through an electrode control line 168 to provide power to the electrodes 162 and facilitate chucking of the substrate 154 during processing of the substrate 154.

Powering the electrodes 162 with electrode power supply 166 generates an electric field to attract the substrate 154 toward the electrodes 162 and the substrate support surface 180 so as to secure the substrate 154 to the substrate support surface 180 of the substrate support assembly 104. The electrode power supply 166 may apply a DC voltage to the electrodes 162. A leakage current sensor 178 is coupled to the electrodes 162, via the electrode power supply 166, to measure leakage current that flows between the substrate 154 and the electrodes 162. In some embodiments, the leakage current sensor 178 is directly coupled to the electrode control line 168.

In some embodiments, the substrate support assembly 104 includes additional electrodes 162 for use in combination with top electrode 108 to generate plasma during the processing of the substrate 154. The use of the top electrode 108 and additional electrodes 162 disposed either in the substrate support assembly 104 or proximate the substrate support assembly 104 to generate plasma may have a variety of embodiments. In addition, one or more of the electrodes 162 may be used in combination with the top electrode 108 to generate plasma during the processing of the substrate 154.

In some embodiments, the electrode power supply 166 provides up to about 1000 W (but not limited to about 1000 W) of RF energy at a frequency of, for example, approximately 13.56 MHz, although other frequencies and powers may be provided depending on the application. The electrode power supply 166 is capable of producing either or both of continuous or pulsed power. In some aspects, the bias source may be a DC or pulsed DC source. In some aspects, the bias source is capable of providing multiple frequencies, such as 13.56 MHz and 2 MHz.

The substrate support assembly 104 further includes a heater apparatus 170 disposed therein. The heater apparatus 170 is used to heat the substrate 154, and may incidentally heat the process volume 120 of the process chamber 100 during the processing of the substrate 154. The heater apparatus 170 is coupled to a heater power supply 172 through a heater control line 174. The heater apparatus 170 includes a heater element 176 that outputs heat. In one embodiment, the heater element 172 is a resistive heater. Conduits (not shown) in the substrate support assembly 104 provide pathways between the heater apparatus 170 and the substrate support surface 180 and the process volume 120 to facilitate application of heat to the substrate 154. In some embodiments, the heater apparatus 170 disposed external to the substrate support assembly 104 and proximate to the process volume 120 to heat the substrate 154 during a processing operation for processing the substrate 154. In this embodiment, the heater apparatus 170 is disposed in the lid assembly 106.

A heater temperature sensor 182 is used to determine the temperature of the heater apparatus 170. The heater temperature sensor 182 utilizes a thermocouple to determine a temperature of the heater apparatus 170. The heater temperature sensor 182 may be in the form of other sensors used to measure temperature of the heater apparatus 170, including a thermistor and lattice vibration sensor. The heater temperature sensor 182 is coupled by a sensor control line 184 to a system controller 186. The system controller 186 is coupled to the heater power supply 172 to control the temperature of the heater apparatus 170. The system controller 186 adjusts parameters of the heater apparatus 170 to adjust and control the temperature of the heater apparatus 170.

In one example, the system controller 186 is a general purpose computer that includes a memory for storing software. In another example, the system controller 186 is a special purpose computer configured to facilitate software implemented control of one or more substrate processing operations. The software includes instructions for controlling the process chamber 100, including the temperature of the heater apparatus 170 to control the temperature of substrate 154 during processing.

Over time, as more substrates 154 are processed in the process chamber 100, the substrate temperature may vary during process despite the setpoint of the heater apparatus 170 remaining fixed. This variation in substrate temperature may be due to a variety of heat inputs and outputs to the substrate 154. For example, radiative boundary conditions of the process chamber 100 may change due to coatings on the surface of components or aging of components in the process chamber 100, including components that surround the process volume 120.

Surfaces of chamber components in the processing chamber 100 may be coated by deposits during processing. The coating may incrementally increase for each additional processing run in a process cycle. Incrementally increasing the coatings in the processing chamber 100 during each processing run may result in a change in the operation of the processing chamber 100. For example, a given heater setpoint may result in different substrate temperatures as the coatings become thicker.

The substrate temperature may be impacted by a variety of factors. Plasma power may add a source of heat to provide thermal energy to the substrate 154 during the processing operation. In addition, certain components in the processing chamber 100 may operate at different temperatures due to a variety of reasons, including plasma coupling and changes in emissivity of various chamber components. The different conditions often result in variations of the heat input to the substrate 154 and the substrate temperature at a selected heater temperature setpoint during the processing operation.

Figure 2:
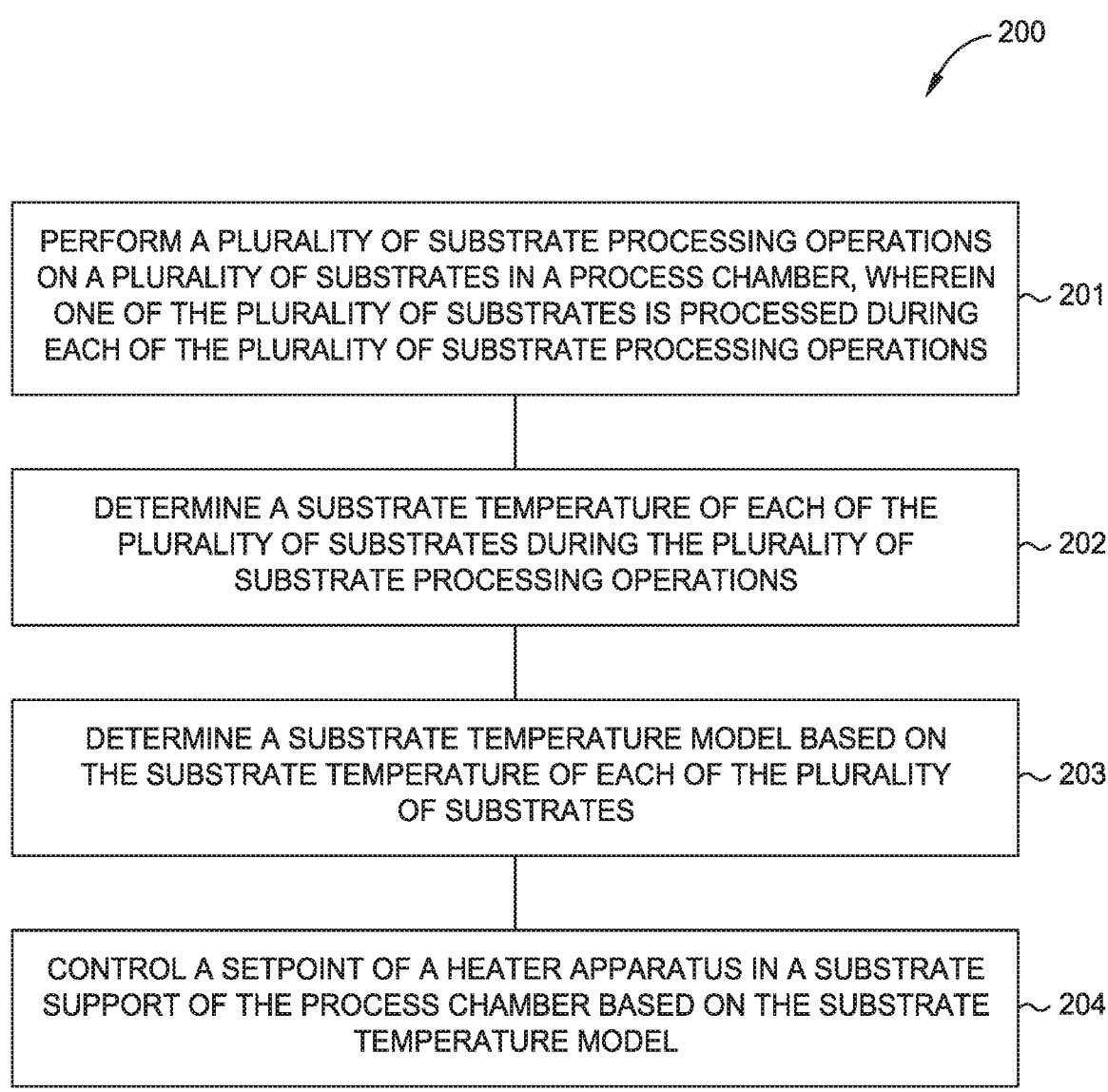
FIG. 2 illustrates a flow diagram of a method according to one embodiment.

FIG. 2 illustrates a flow diagram of a method 200 for predicting substrate temperature changes and adjusting heater apparatus setpoints, according to one embodiment. At operation 201, the method 200 includes performing a plurality of substrate processing operations on a plurality of substrates in a process chamber, wherein one of the plurality of substrates is processed during each of the plurality of substrate processing operations. At operation 202, a substrate temperature is determined for each of the plurality of substrates during an associated substrate processing operation. At operation 203, the determined substrate temperatures are used to create a substrate temperature change model. At operation 204, the substrate temperature change model is used to control a setpoint of the heater apparatus for future substrate processing operations. Thus, the method 200 enables adaptive temperature control of substrates in response to variable process chamber characteristics.

Figure 3:
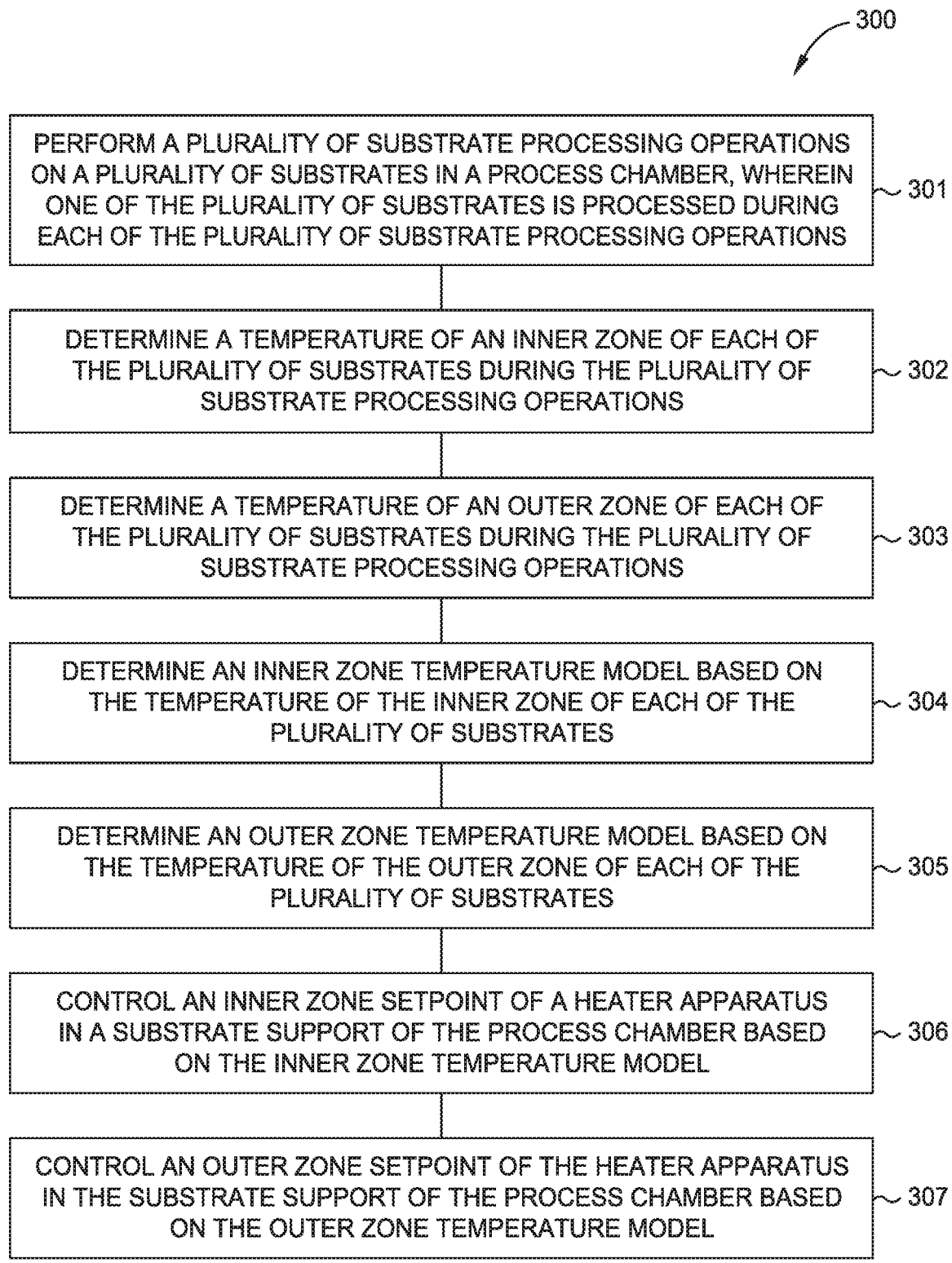
FIG. 3 illustrates a flow diagram of a method according to one embodiment.

FIG. 3 illustrates a flow diagram of a method 300 for predicting temperature changes in inner and outer zones of substrates and adjusting heater apparatus setpoint for both the inner and outer zones, according to one embodiment. As used herein, inner zone refers to a region including the center of the substrate, and outer zone refers to a region surrounding the inner zone and extending to the edge of the substrate. For example, for a circular 300 mm diameter substrate, the inner zone may be a circular region 100 mm in diameter, and the outer zone may be an annular region extending from the edge of the inner zone to the edge of the substrate.

At operation 301, the method 300 includes performing a plurality of substrate processing operations on a plurality of substrates in a process chamber, wherein one of the plurality of substrates is processed during each of the plurality of substrate processing operations. At operation 302, an inner zone temperature is determined for each substrate during an associated substrate processing operation. At operation 303, an outer zone temperature is determined for each substrate during the substrate's associated substrate processing operation. At operation 304, the determined inner zone temperatures are used to create an inner zone temperature model. At operation 305, the determined outer zone temperatures are used to create an outer zone temperature model. At operation 306, the inner zone temperature model is used to control an inner zone setpoint of the heater apparatus. And at operation 307, the outer zone temperature model is used to control an outer zone setpoint of the heater apparatus.

Figure 4A:
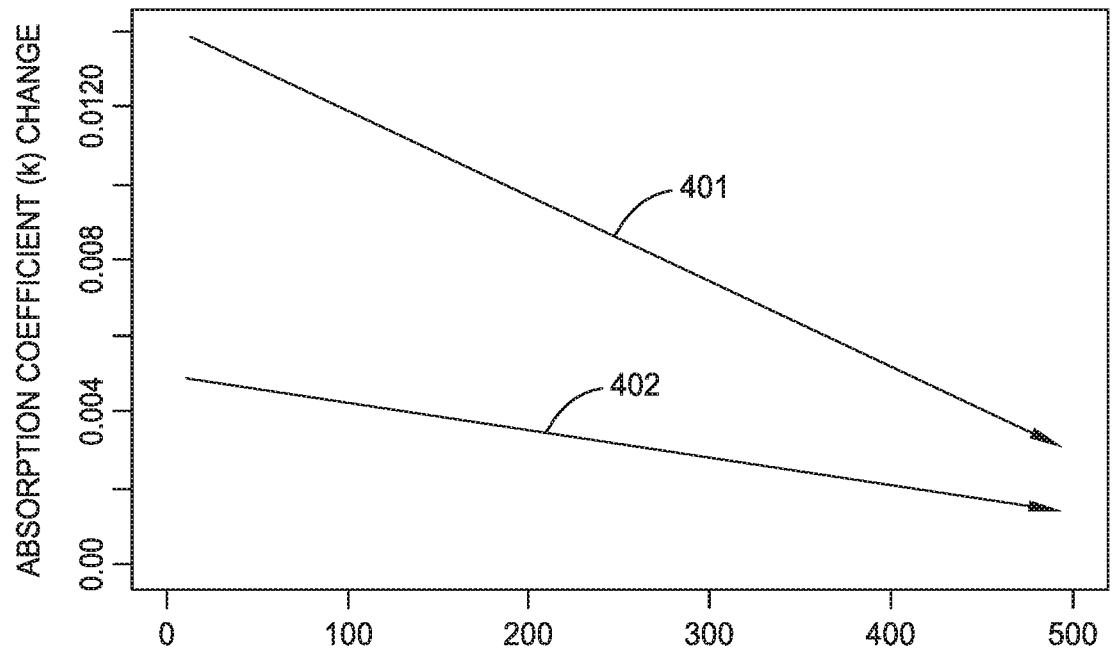
FIG. 4A is data of a plot of substrate count since a maintenance event versus optical absorption coefficient of a film deposited on a substrate according to one embodiment.
Figure 4B:
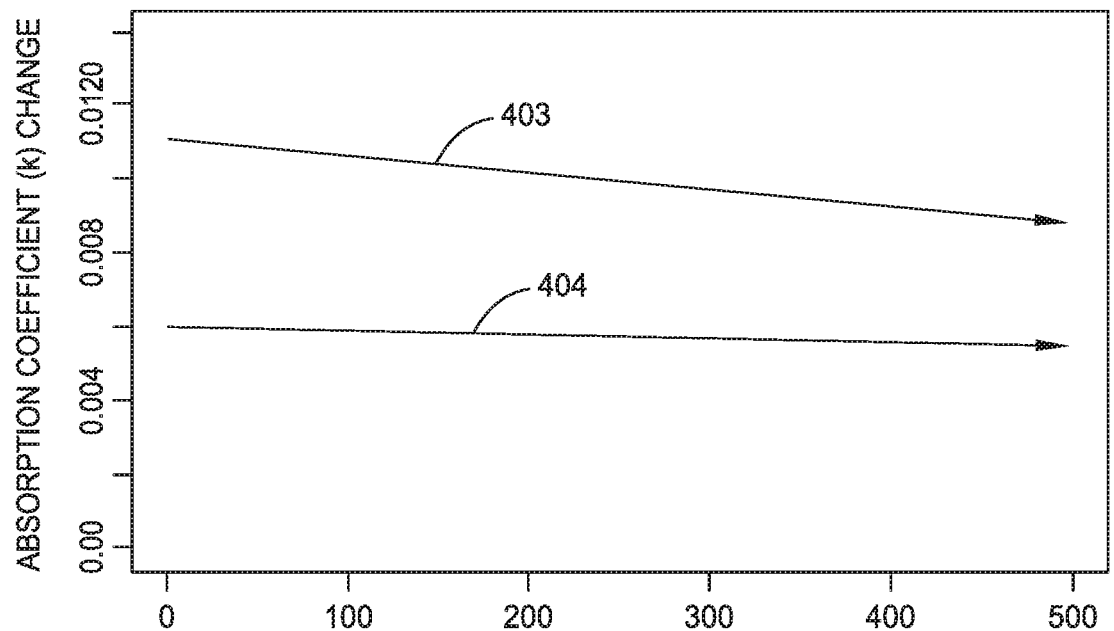
FIG. 4B is data of a plot of substrate count since a maintenance event versus optical absorption coefficient of a film deposited on a substrate according to one embodiment.

At operation 202 of method 200 and operations 302 and 303 of method 300, the temperatures can be determined in a number of ways. In some embodiments, the substrate processing operation includes depositing a film on the substrate 154. The film, for instance, may be a carbon hardmask. A temperature-dependent property of the film can be measured and the temperature determined based on the temperature-dependent property. For example, the temperature-dependent property may be the optical absorption coefficient (optical k) of the film. FIGS. 4A and 4B are data curves illustrating this relationship, showing how substrate temperature, and thus optical k of the deposited film, drifts over subsequent substrate processing operations.

FIG. 4A is a plot of substrate count since a maintenance event versus optical absorption coefficient of a film deposited on a substrate, according to one embodiment. The data 401 and 402 are fits to variables measured in an experimental set up where the process chamber used was fitted with "new" components. i.e., components which had seen no or a small number of substrate processing operations. Data 401 shows substrate count versus optical k for the inner zones of the substrates, and data 402 shows substrate count versus optical k for the outer zones of the substrates. Since the optical k of the deposited film depends on the substrate temperature during processing, data 401 and data 402 illustrate not only that substrate temperature drifts over successive substrate processing operations, but that inner zone temperature drifts faster than outer zone temperature.

FIG. 4B is a plot of substrate count since a maintenance event versus optical absorption coefficient of a film deposited on a substrate, according to one embodiment. The data 403 and 404 are fits to variables measured in an experimental set up where the process chamber used was fitted with "old" components, i.e., components which had seen a large number of substrate processing operations. Data 403 shows substrate count versus optical k for the inner zones of the substrates, and data 404 shows substrate count versus optical k for the outer zones of the substrates. Since the optical k of the deposited film depends on the substrate temperature during processing, data 403 and data 404 illustrate not only that substrate temperature drifts over successive substrate processing operations, but that inner zone temperature drifts faster than outer zone temperature.

In other embodiments, the temperatures at operation 202 of method 200 and operations 302 and 303 of method 300 are determined by measuring a power output of the heater apparatus during intervals of time during the substrate processing operations. This method is discussed with regards to FIGS. 5 and 6 below.

Figure 5:
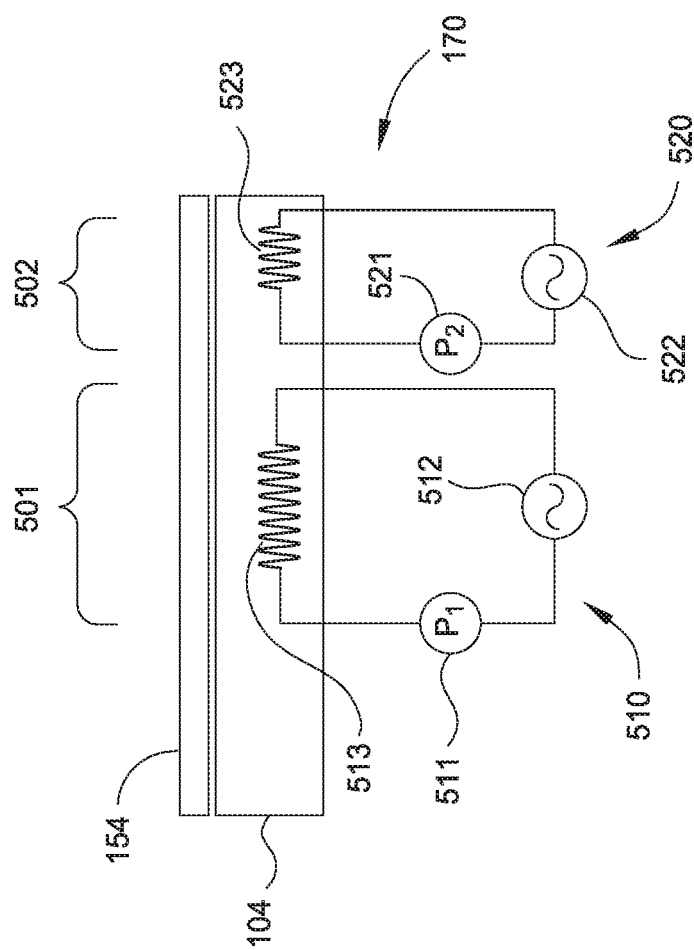
FIG. 5 illustrates a cross-sectional schematic view of a substrate support with a heater apparatus according to one embodiment.

FIG. 5 illustrates a cross-sectional schematic view of the substrate support 104 with the heater apparatus 170 of FIG. 1. The substrate support 104 supports the substrate 154 and the heater apparatus 170 is disposed in the substrate support 104. The substrate support 104 is divided into an inner zone 501 and an outer zone 502. The heater apparatus 170 (shown as a resistive heater) contains separate heaters for each of the zones: an inner heater 510 for the inner zone 501 and an outer heater 520 for the outer zone 502. The inner heater 510 includes a power meter 511, a power supply 512, and a resistive heating element 513. Likewise, the outer heater 520 includes power meter 521, power supply 522, and resistive heating element 523. The power supplies 512 and 522 may be part of the heater power supply 172 as shown in FIG. 1. The inner heater 510 and outer heater 520 are also coupled to heater temperature sensors (not shown), which are coupled to the controller 186 shown in FIG. 1.

During operation, the heater apparatus 170 responds to changes in temperature in either the inner zone 501 or the outer zone 502 by changing power output of the power supply 512 or the power supply 522. A change in power output is contemplated to be directly proportional to a change in temperature. However, due to the frequency of the power supplies 512 and 513 (for example, 50 Hz), attempting to measure the power output instantaneously results in a noisy data set that is difficult to extract a temperature from. Instead, power meters 511 and 521 record the total power output over a period of time that is relatively long compared to the cycling period of the power supplies 512 and 513. For example, for a 50 Hz power supply, the power meters 511 and 521 measure the total power output over a period of about 1 second to about 10 minutes, such as about 2 minutes. Thus, rather than attempt to extract temperature from instantaneous power measurements, temperature changes can be extracted from power output changes across successive time intervals. In one embodiment, the power meters 511 and 521 measure a peak-to-peak power fluctuation and software communicatively coupled to the power meters 511 and 521 calculates a mean power output to enable lower frequency data acquisition.

Figure 6:
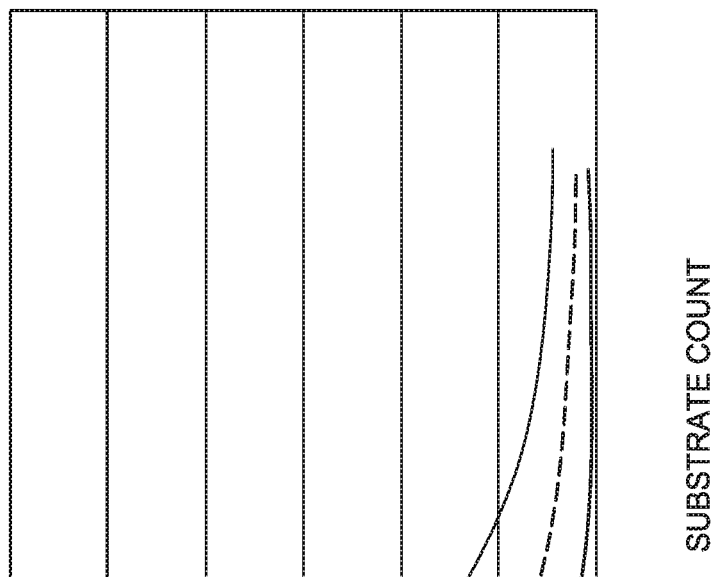
FIG. 6 is data of a plot of substrate count since a maintenance event versus a change in temperature for each successive substrate.

FIG. 6 is a plot of substrate count since a maintenance event versus a change in temperature for each successive substrate. Regardless of the method used to determine temperatures, the temperature change can then be plotted as a function of substrate count since the last maintenance event. In FIG. 6, the y-axis is temperature change per substrate (multiplied by 100 to normalize the scale) in degrees Celsius. The x-axis is substrate count since the last maintenance event. Data 601, 602, and 603 are fits to results for similar processes as described with regard to FIGS. 4A and 4B. Data 601 is representative of the inner zone, data 603 is representative of the outer zone, and data 602 is representative of the mean across the substrate 154. Similar to FIGS. 4A and 4B, the data 601 and 603 show that substrate temperature changes more rapidly in the inner zone than in the outer zone.

Once temperatures have been determined, either for the substrate as a whole for method 200 or for the inner and outer zones for method 300, the temperature changes over time are used to build temperature models in operation 203 of method 200 and operations 304 and 305 of operation 300. One method of building these models is via machine learning techniques. For example, based on the temperature change data, the following equations may be used to predict temperature change for inner and outer zones of the substrate from a first substrate $W_1$ and a second substrate $W_2$:

$$\Delta T_i = \int_{W_1}^{W_2} \frac{dT_i}{dW} dW$$

$$\Delta T_o = \int_{W_1}^{W_2} \frac{dT_o}{dW} dW$$

where $\Delta T_i$ and $\Delta T_o$ are the total change in temperature of the inner and outer zones, respectively, from $W_1$ to $W_2$.

$$\frac{dT_i}{dW} \text{ and } \frac{dT_o}{dW}$$

are the rate of change of inner zone temperature and outer zone temperature, respectively, per wafer count W from last maintenance event. It should be noted that W is tracked by software and resets upon a maintenance event. In one embodiment, $W_1$ is a first substrate count for a first substrate, $W_2$ is a second substrate count for the first substrate. Once these models have been built, the models can be used to adjust heater apparatus setpoints for future substrate processing operations, as in operation 204 of method 200 and operations 306 and 307 of method 300.

The methods described herein enable numerous improvements for substrate processing operations. The present disclosure provides various methods of determining substrate temperatures indirectly. By determining the temperatures and building models to predict how substrate temperatures will change over the lifetimes of chambers and components, heater setpoints can be adjusted to help substrate temperatures remain within desirable process parameters. Doing so can both reduce downtime for maintenance and improve device quality, especially when process parameters dictate a range of only a few degrees Celsius.

While the foregoing is directed to examples of the present disclosure, other and further examples of the disclosure may be devised without departing from the basic scope thereof, and the scope thereof is determined by the claims that follow.

What is claimed is:

1. A method, comprising:
performing a plurality of substrate processing operations on a plurality of substrates in a process chamber, wherein one of the plurality of substrates is processed during each of the plurality of substrate processing operations;
determining a substrate temperature change of each of the plurality of substrates during the plurality of substrate processing operations;
inputting measured process variables into a substrate temperature change model based on the substrate temperature of each of the plurality of substrates, the substrate temperature change model comprising:

$$\Delta T_i = \int_{W_1}^{W_2} \frac{dT_i}{dW} dW$$

$$\Delta T_o = \int_{W_1}^{W_2} \frac{dT_o}{dW} dW$$

where $W_1$ is a first substrate count for a first substrate, $W_2$ is a second substrate count for the first substrate, $\Delta T_i$, and $\Delta T_o$, are a total change in temperature of inner and outer zones, respectively, from $W_1$ to $W_2$, and $$\frac{dT_i}{dW} \text{ and } \frac{dT_o}{dW}$$

are a rate of change of inner zone temperature and outer zone temperature, respectively; and
controlling one or more of temperature or power setpoints of a heater apparatus in a substrate support of the process chamber in response to an output of the substrate temperature change model.

2. The method of claim 1, wherein the heater apparatus is a resistive heater.

3. The method of claim 1, wherein the determining a substrate temperature of each of the plurality of substrates further comprises:
measuring a temperature-dependent film property of a film deposited on each of the plurality of substrates during the plurality of substrate processing operations; and
determining the substrate temperature of each of the plurality of substrates based on the temperature-dependent film property.

4. The method of claim 3, wherein the temperature-dependent film property is an optical absorption coefficient.

5. The method of claim 3, wherein the film is a carbon hardmask.

6. The method of claim 1, wherein the determining a substrate temperature of each of the plurality of substrates further comprises:
measuring a power output of the heater apparatus during each of a plurality of time intervals during each of the plurality of substrate processing operations; and
determining the substrate temperature of each of the plurality of substrates based on the power output during each of the plurality of time intervals.

7. The method of claim 6, wherein the power output is measured using a power meter.

8. A method, comprising:
performing a plurality of substrate processing operations on a plurality of substrates in a process chamber, wherein one of the plurality of substrates is processed during each of the plurality of substrate processing operations;
determining a temperature of an inner zone of each of the plurality of substrates during the plurality of substrate processing operations, comprising:
measuring a power output of the heater apparatus corresponding to the inner zone of the substrate during each of a plurality of time intervals during each of the plurality of substrate processing operations; and
determining the inner zone temperature of each of the plurality of substrates based on the power output during each of the plurality of time intervals;
determining a temperature of an outer zone of each of the plurality of substrates during the plurality of substrate processing operations;
determining an inner zone temperature model based on the temperature of the inner zone of each of the plurality of substrates;
determining an outer zone temperature model based on the temperature of the outer zone of each of the plurality of substrates;
controlling an inner zone setpoint of a heater apparatus in a substrate support of the process chamber based on the inner zone temperature model; and
controlling an outer zone setpoint of the heater apparatus in the substrate support of the process chamber based on the outer zone temperature model.

9. The method of claim 8, wherein the heater apparatus is a resistive heater.

10. The method of claim 8, wherein the determining an inner zone temperature of each of the plurality of substrates further comprises:
measuring a temperature-dependent film property in the inner zone of the substrate of a film deposited on each of the plurality of substrates during the plurality of substrate processing operations; and
determining the inner zone temperature of each of the plurality of substrates based on the temperature-dependent film property.

11. The method of claim 8, wherein the determining an outer zone temperature of each of the plurality of substrates further comprises:
measuring a temperature-dependent film property in the outer zone of the substrate of a film deposited on each of the plurality of substrates during the plurality of substrate processing operations; and
determining the outer zone temperature of each of the plurality of substrates based on the temperature-dependent film property.

12. The method of claim 10, wherein the temperature-dependent film property is an optical absorption coefficient.

13. The method of claim 11, wherein the temperature-dependent film property is an optical absorption coefficient.

14. The method of claim 10, wherein the film is a carbon hardmask.

15. The method of claim 11, wherein the film is a carbon hardmask.

16. The method of claim 8, wherein the power output is measured using a power meter.

17. A method, comprising:
performing a plurality of substrate processing operations on a plurality of substrates in a process chamber, wherein one of the plurality of substrates is processed during each of the plurality of substrate processing operations;
determining a temperature of an inner zone of each of the plurality of substrates during the plurality of substrate processing operations;
determining a temperature of an outer zone of each of the plurality of substrates during the plurality of substrate processing operations, comprising:
measuring a power output of the heater apparatus corresponding to the outer zone of the substrate during each of a plurality of time intervals during each of the plurality of substrate processing operations; and
determining the outer zone temperature of each of the plurality of substrates based on the power output during each of the plurality of time intervals;
determining an inner zone temperature model based on the temperature of the inner zone of each of the plurality of substrates;
determining an outer zone temperature model based on the temperature of the outer zone of each of the plurality of substrates;
controlling an inner zone setpoint of a heater apparatus in a substrate support of the process chamber based on the inner zone temperature model; and
controlling an outer zone setpoint of the heater apparatus in the substrate support of the process chamber based on the outer zone temperature model.

18. The method of claim 17, wherein the power output is measured using a power meter.

19. The method of claim 17, wherein the determining an inner zone temperature of each of the plurality of substrates further comprises:
measuring a temperature-dependent film property in the inner zone of the substrate of a film deposited on each of the plurality of substrates during the plurality of substrate processing operations; and
determining the inner zone temperature of each of the plurality of substrates based on the temperature-dependent film property.

20. The method of claim 17, wherein the determining an outer zone temperature of each of the plurality of substrates further comprises:
measuring a temperature-dependent film property in the outer zone of the substrate of a film deposited on each of the plurality of substrates during the plurality of substrate processing operations; and
determining the outer zone temperature of each of the plurality of substrates based on the temperature-dependent film property.

21. A non-transitory machine readable storage medium having stored thereon a computer program, the computer program configured to:
determine a substrate temperature change model based on a substrate temperature of each of a plurality of substrates during each of a plurality of substrate processing operations in a process chamber;
control a setpoint of a heater apparatus in a substrate support of the process chamber based on a substrate temperature change model, the substrate temperature model comprising:

$$\Delta T_i = \int_{W_1}^{W_2} \frac{dT_i}{dW} dW$$

-continued $$\Delta T_o = \int_{W_1}^{W_2} \frac{dT_o}{dW} dW$$

where $W_1$ is a first substrate count for a first substrate, $W_2$ is a second substrate count for the first substrate, $\Delta T_i$ and $\Delta T_o$, are a total change in temperature of inner and outer zones, respectively, from $W_1$ to $W_2$, and $$\frac{dT_i}{dW} \text{ and } \frac{dT_o}{dW}$$

are a rate of change of inner zone temperature and outer zone temperature, respectively.

* * * * *

UNITED STATES PATENT AND TRADEMARK OFFICE
CERTIFICATE OF CORRECTION

PATENT NO. : 11,024,522 B2  
APPLICATION NO. : 16/383881  
DATED : June 1, 2021  
INVENTOR(S) : Hemant Mungekar et al.

Page 1 of 1

It is certified that error appears in the above-identified patent and that said Letters Patent is hereby corrected as shown below:

In the Claims

In Column 10, Line 25, in Claim 1, delete "$\Delta T_i$," and insert -- $\Delta T_i$ --, therefor.

In Column 10, Line 26, in Claim 1, delete "$\Delta T_o$," and insert -- $\Delta T_o$ --, therefor.

In Column 13, Line 8, in Claim 21, delete "$\Delta T_o$," and insert -- $\Delta T_o$ --, therefor.

Signed and Sealed this  
Twenty-fourth Day of August, 2021

Drew Hirshfeld  
*Performing the Functions and Duties of the*  
*Under Secretary of Commerce for Intellectual Property and*  
*Director of the United States Patent and Trademark Office*